(12) United States Patent
Hazel et al.

(10) Patent No.: US 11,725,269 B2
(45) Date of Patent: *Aug. 15, 2023

(54) DEPOSITION APPARATUS AND METHODS

(71) Applicant: Raytheon Technologies Corporation, Farmington, CT (US)

(72) Inventors: Brian T. Hazel, Avon, CT (US); Michael J. Maloney, Marlborough, CT (US); James W. Neal, Jupiter, FL (US); David A. Litton, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/844,199

(22) Filed: Jun. 20, 2022

(65) Prior Publication Data

US 2022/0316048 A1 Oct. 6, 2022

Related U.S. Application Data

(62) Division of application No. 16/527,250, filed on Jul. 31, 2019, now Pat. No. 11,365,473, which is a
(Continued)

(51) Int. Cl.
*C23C 14/30* (2006.01)
*C23C 14/24* (2006.01)
(Continued)

(52) U.S. Cl.
CPC ............ *C23C 14/30* (2013.01); *C23C 14/228* (2013.01); *C23C 14/243* (2013.01); *C23C 14/246* (2013.01); *C23C 14/505* (2013.01)

(58) Field of Classification Search
CPC ... C23C 14/228; C23C 14/243; C23C 14/246; C23C 14/30; C23C 14/505
See application file for complete search history.

(56) References Cited

U.S. PATENT DOCUMENTS 4,627,989 A 12/1986 Feuerstein et al.
5,785,763 A 7/1998 Onda et al.
(Continued)

FOREIGN PATENT DOCUMENTS

DE 102006031244 A1 1/2008
DE 102010017896 A1 10/2011
WO WO 2011/131172 * 10/2011

OTHER PUBLICATIONS

International Search Report and Written Opinion dated Aug. 6, 2014 for PCT/US2014/028489.
(Continued)

*Primary Examiner* — Elizabeth A Burkhart
(74) *Attorney, Agent, or Firm* — Bachman & LaPointe, P.C.

(57) ABSTRACT

A deposition apparatus (20) comprising: a chamber (22); a process gas source (62) coupled to the chamber; a vacuum pump (52) coupled to the chamber; at least two electron guns (26); one or more power supplies (30) coupled to the electron guns; a plurality of crucibles (32,33,34) positioned or positionable in an operative position within a field of view of at least one said electron gun; and a part holder (170) having at least one operative position for holding parts spaced above the crucibles by a standoff height H. The standoff height H is adjustable in a range including at least 22 inches.

20 Claims, 15 Drawing Sheets

Related U.S. Application Data division of application No. 14/774,489, filed as application No. PCT/US2014/028489 on Mar. 14, 2014, now Pat. No. 10,385,444.

(60) Provisional application No. 61/800,727, filed on Mar. 15, 2013.

(51) Int. Cl.
*C23C 14/22* (2006.01)
*C23C 14/50* (2006.01)

(56) References Cited

U.S. PATENT DOCUMENTS

| | | |
|---|---|---|
| 5,888,305 A | 3/1999 | Szczyrbowski et al. |
| 5,993,622 A | 11/1999 | Szczyrbowski et al. |
| 6,342,278 B1 | 1/2002 | Rigney et al. |
| 6,447,854 B1 | 9/2002 | Rigney et al. |
| 6,548,946 B1 | 4/2003 | Zengel |
| 8,110,043 B2 | 2/2012 | Hass et al. |
| 8,191,504 B2 | 6/2012 | Blankenship |
| 2003/0140855 A1 | 7/2003 | Rigney et al. |
| 2004/0211363 A1* | 10/2004 | Bruce .................. C23C 14/548 118/715 |
| 2006/0057406 A1 | 3/2006 | Darolia et al. |
| 2009/0017217 A1 | 1/2009 | Hass et al. |
| 2010/0104766 A1 | 4/2010 | Neal et al. |
| 2010/0129564 A1 | 5/2010 | Shembel et al. |
| 2010/0247809 A1 | 9/2010 | Neal |
| 2013/0032092 A1 | 2/2013 | Hotz et al. |
| 2013/0209706 A1* | 8/2013 | Hotz .................... C23C 14/246 118/727 |

OTHER PUBLICATIONS

European Partial Search Report dated Oct. 26, 2016 for EP Patent Application No. 14765262.2.
Extended European Search Report dated Mar. 31, 2017 for EP Patent Application No. 14765262.2.
U.S. Office Action dated Jun. 12, 2018 for U.S. Appl. No. 14/774,489.
U.S. Office Action dated Jan. 3, 2019 for U.S. Appl. No. 14/774,489.
European Office Action dated Jan. 24, 2019 for European Patent Application No. 14765262.2.
U.S. Office Action dated Jun. 23, 2021 for U.S. Appl. No. 16/527,250.

* cited by examiner

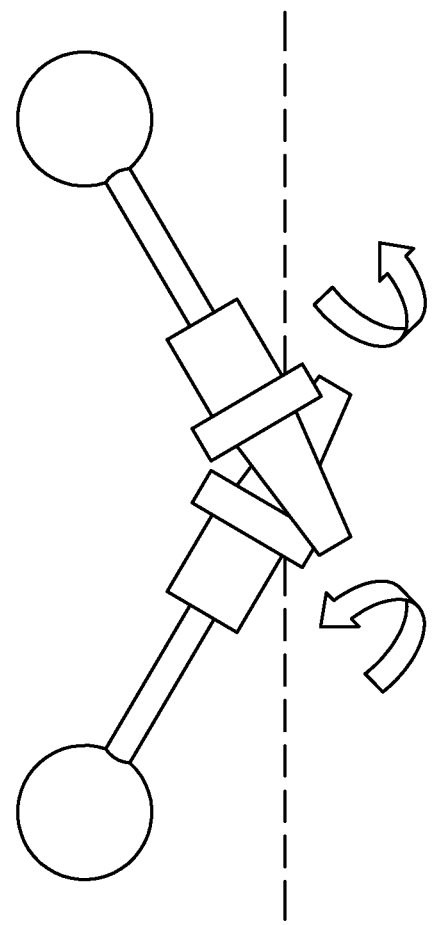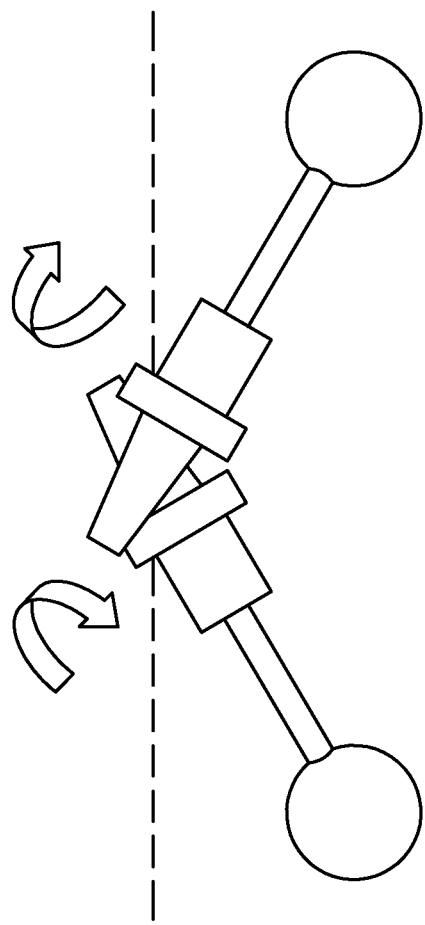
FIG. 2A
FIG. 2B

DEPOSITION APPARATUS AND METHODS

CROSS-REFERENCE TO RELATED APPLICATIONS

This is a divisional application of U.S. patent application Ser. No. 14/774,489, filed Sep. 10, 2015 and entitled "Deposition Apparatus and Methods" which is a 371 US national stage application of PCT/2014/028489, filed Mar. 14, 2014, which claims benefit of U.S. Patent Application No. 61/800,727, filed Mar. 15, 2013, the disclosures of which are incorporated by reference herein in their entireties as if set forth at length.

BACKGROUND

The disclosure relates to deposition of aerospace coatings. More particularly, the disclosure relates to electron beam physical vapor deposition (EB-PVD) of ceramic thermal barrier coatings (TBC).

The current state of the art thermal barrier coatings (TBC) are produced by EB-PVD with a line of sight deposition capability. Line-of-sight deposition occurs with the process done in a vacuum chamber at absolute pressures varying from $1 \times 10^{-4}$ to $1.5e^{-2}$ Torr (0.013 to 2.0 Pa), as disclosed in Rigney, et al., U.S. Pat. Nos. 6,342,278 and 6,447,854. Vacuum levels below $1.5^{e-2}$ Torr (2.0 Pa) ensure robust and durable operation of the electron beam guns. At these pressures, the mean free paths of gas and vapor molecules in the vacuum chamber are at least as long as the size of the chamber. Thus, on average, gas and vapor molecules travel from the vapor source to the part being coated without colliding with other gas or vapor molecules. Thus, on average, depositing vapor molecule trajectories are straight lines, leading to line-of-sight deposition.

Because TBCs are critical to part life and operation, TBC thickness and coat zones are an input factor in part design. Today turbine vanes are typically manufactured as singlets to enable much more uniform TBC thickness to allow these parts to operate in higher temperature environments. However, a doublet (or triplet, etc.) has advantages in minimizing leakage losses between parts. There have been problems obtaining uniform coatings on areas of each doublet airfoil which become occluded by the other during deposition (see, e.g., U.S. Pat. No. 8,191,504 of Blankenship).

Similar TBC thickness issues occur on other parts as well including turbine blades. Optimizing deposition for the airfoil of a turbine blade results in low thickness build on the platform region. Complex manipulation today has improved the thickness distribution but an increase in non-line-of-sight (NLOS) deposition is desired for these components as well.

Modifications to the EB-PVD process are known in the prior art that enable NLOS deposition. The directed vapor deposition (DVD) process relies on supersonic jets surrounding the vapor source to improve NLOS deposition, as disclosed in U.S. Pat. No. 8,110,043 to Hass et al.

SUMMARY

One aspect of the disclosure involves a deposition apparatus comprising: a chamber; a process gas source coupled to the chamber; a vacuum pump coupled to the chamber; at least two electron guns; one or more power supplies coupled to the electron guns; a plurality of crucibles positioned or positionable in an operative position within a field of view of at least one said electron gun; and a part holder having at least one operative position for holding parts spaced above the crucibles by a standoff height H. The standoff height H is adjustable in a range including at least 22 inches.

In one or more embodiments of any of the foregoing embodiments, a process gas inlet is located at the bottom of the coating chamber.

In one or more embodiments of any of the foregoing embodiments, the range includes 8 to 25 inches.

In one or more embodiments of any of the foregoing embodiments, the range includes 15 to 22 inches.

In one or more embodiments of any of the foregoing embodiments, the part holder is mounted to a retractable sting shaft.

In one or more embodiments of any of the foregoing embodiments, the part holder is a rake having a pair of arms and, along each arm, a plurality of rotary part-holding stations.

In one or more embodiments of any of the foregoing embodiments: the plurality of crucibles comprises a first set of crucibles and a second set of crucibles; and an actuator is coupled to the first and second sets of crucibles to shift the first and second sets into and out of the operative position.

In one or more embodiments of any of the foregoing embodiments: each of the plurality of crucibles has an associated ingot loader; and the ingot loaders of the first set are different from the ingot loaders of the second set; and the ingot loaders of the first set carry ingots of different composition than do the ingot loaders of the second set.

In one or more embodiments of any of the foregoing embodiments, the crucibles contain a ceramic melt.

In one or more embodiments of any of the foregoing embodiments, one or more of: a pump and flow controller feedback system is capable of controlling the chamber pressure within +/−7% of setpoint pressure over the full range of process gas flowrates from 100 sccm to 100 slm; the power supply can be switched between operation in the range 20-40 kV to operating in the range 41-80 kV, with no change in power delivered to the coating chamber.

In one or more embodiments of any of the foregoing embodiments, a method for using the apparatus comprises: controlling the process gas source and the vacuum pump to maintain an atmosphere of 3-30 Pa absolute pressure; and controlling the electron guns and power supplies to 20 to 90 kV at 160-300 kW per gun.

In one or more embodiments of any of the foregoing embodiments: the part holder holds a plurality of vane doublets, each comprising an inboard shroud and an outboard shroud and a pair of airfoils therebetween; and parts are rotated around their radial axis at a constant rotation rate from 4 to 120 rpm, while simultaneously being tilted over a range from −45 to +45 degrees.

In one or more embodiments of any of the foregoing embodiments, the part holder holds a plurality of blades, each comprising: an airfoil having a substrate having a leading edge, a trailing edge, a pressure side, and a suction side and extending from an inboard end to a tip; and an attachment root; and parts are rotated around their radial axis at a constant rotation rate from 4 to 120 rpm, while simultaneously being tilted over a range from −45 to +45 degrees.

Another aspect of the disclosure involves a method for operating a deposition apparatus, the deposition apparatus comprising: a chamber; a process gas source coupled to the chamber; a vacuum pump coupled to the chamber; at least two electron guns; one or more power supplies coupled to the electron guns; a plurality of crucibles positioned or positionable in an operative position within a field of view of at least one said electron gun; and a part holder having at least one operative position for holding parts spaced above the crucibles by a standoff height H. The method comprises: adjusting the standoff height H to a value in the range of 8 to 25 inches; controlling the process gas source and the vacuum pump to maintain an atmosphere of 3.0-30 Pa absolute pressure; and controlling the electron guns and power supplies to 20 kV to 90 kV at 160-300 kW per gun.

In one or more embodiments of any of the foregoing embodiments, the absolute pressure is 6.6 Pa to 30 Pa.

In one or more embodiments of any of the foregoing embodiments, H is in a range of 15 inches to 25 inches In one or more embodiments of any of the foregoing embodiments, the method comprises: adjusting the standoff height H to a value in the range of 8 to 18 inches; controlling the process gas source and the vacuum pump to maintain an atmosphere of at most 2.0 Pa absolute pressure.

In one or more embodiments of any of the foregoing embodiments, the controlling of the process gas source results in flowrates 3 to 100 slm.

In one or more embodiments of any of the foregoing embodiments, the controlling of the process gas source results in flowrates 3 to 40 slm.

In one or more embodiments of any of the foregoing embodiments, the controlling the electron guns and power supplies is to a power of 120 kW to 300 kW per gun.

In one or more embodiments of any of the foregoing embodiments, the control is such that a thickness ratio deposited on a flat plate held stationary above the crucibles at any point, x, y, z can be approximated by the equation:

$$\text{Thickness/Max Thickness} = \cos^n(\theta_1) + \cos^n(\theta_2) + \cos^n(\theta_3), \text{ where } n \text{ ranges from 5 to 25}$$

The details of one or more embodiments are set forth in the accompanying drawings and the description below. Other features, objects, and advantages will be apparent from the description and drawings, and from the claims.

BRIEF DESCRIPTION OF THE DRAWINGS

FIGS. 2A and 2B are schematic end views showing rake arms tilted up and down as parts continuously rotate to ensure uniform coating thickness and microstructure on both the airfoil and platform.

FIGS. 4-1, 4-2, and 4-3 are a sequence of plan views showing shifting of an ingot assembly relative to electron beam sources and parts.

Like reference numbers and designations in the various drawings indicate like elements.

DETAILED DESCRIPTION

Figure 1:
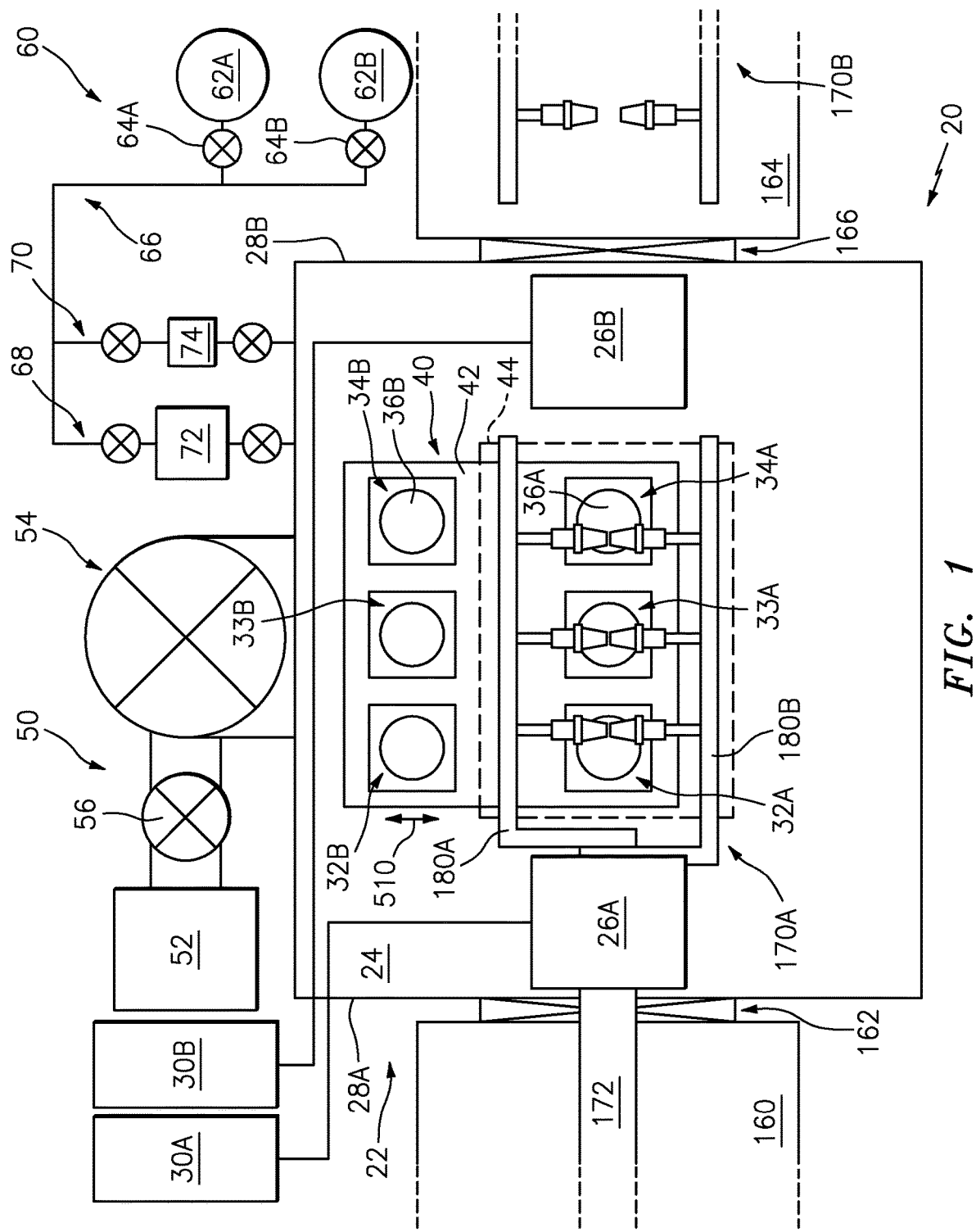
FIG. 1 is a schematic plan view of a deposition apparatus.

FIG. 1 is a partially schematic plan view of a deposition system 20. Coating chamber 22 is shown without moveable load lock chambers and gate valves between the preheat chambers and moveable load lock chambers. Additionally, the pumpsets for the preheat chambers and loadlock chambers are not shown. The chamber has an interior 24 which contains the parts to be coated in an operative position during deposition. The system further includes a pair of electron guns 26A, 26B (collectively 26). The exemplary electron guns are positioned next to respective first and second longitudinal ends 28A, 28B of the chamber. A power supply is provided to power the guns. The exemplary power supply comprises respective power supplies 30A, 30B for the respective guns.

A source of deposition material comprises crucibles for melting ingots of ceramic. As is discussed further below, the exemplary system comprises two sets of crucibles: a first set 32A, 33A, 34A, and a second set, 32B, 33B, 34B. Each of the crucibles 32A, 33A, 34A, contains an ingot/melt pool (atop the ingot) 36A of a first material while each of the crucibles 32B, 33B, 34B contain an ingot/melt pool 36B of a second material. The crucibles are part of an assembly 40 mounted for bidirectional movement in a direction 510 (e.g., via an actuator (not shown)) to alternatingly bring each of the two sets of crucibles into an operative position where each crucible in that set is within the field of view (the beam scanning range) of at least one of the electron guns. In the exemplary FIG. 1 situation, the first set 32A, 33A, 34A is in the operative position while the second set is laterally spaced apart. This enables multilayer ceramic TBC coatings. The exemplary first layer consists of 6-8 wt % $Y_2O_3$, 92-94% $ZrO_2$. The exemplary second layer consists of 53-65 wt % $Gd_2O_3$, 35 to 47 wt % $ZrO_2$. In other embodiments, even more layers can be created, by transitioning the ingots back and forth any number of times. Other variations may add a third or further crucible set (e.g., for depositing a yet different material).

Figure 15:
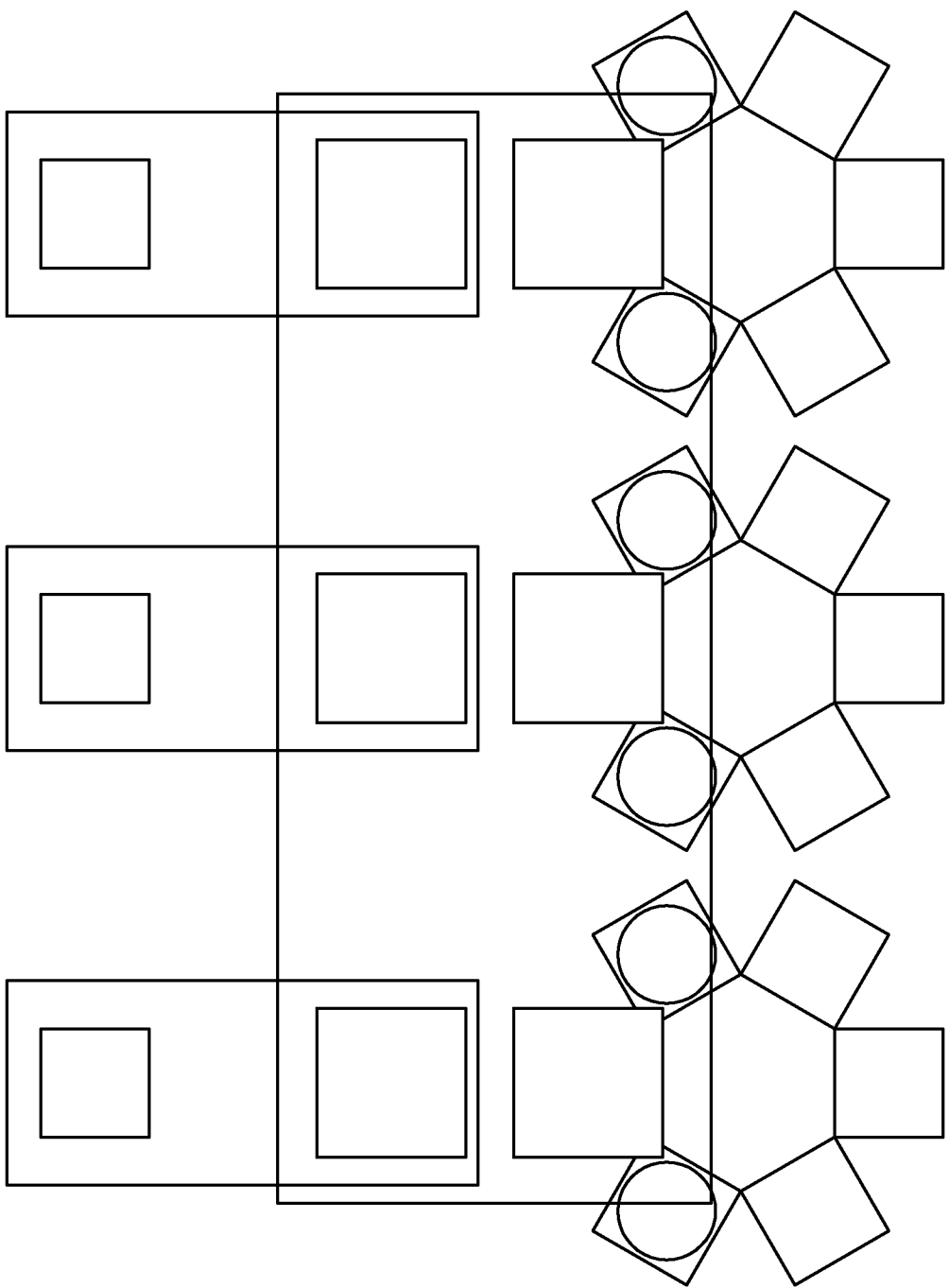
FIG. 15 is a schematic plan view of an ingot loader system.

The assembly 40 may further include an optional gravel tray 42 surrounding the crucibles for rastering by the electron beams to control part temperature. The assembly 40 may further include loaders for each of the crucibles (not shown). An exemplary loader contains multiple ingots so as to be able to feed one ingot while storing one or more other ingots and, thereafter, deliver the stored ingot to the crucible to replenish. The loaders may be rotary cassette loaders (FIG. 15) or linear magazines.

FIG. 1 further shows an optional shroud or radiative heat reflector 44 positioned above the crucibles in the operative position (more particularly, above the parts in their operative position).

FIG. 1 further shows an exemplary load of six parts in the operative position. The six parts are arranged on part holders formed by two rake arms 170A, 170B (collectively or individually 170), three parts per rake arm. The parts attached via tooling (not shown) to rotating shafts that are driven by crown gears (not shown) within the rake arms (180A, 180B). The rake arms are each attached to an associated triaxial sting shaft 172, partially drawn in FIG. 1. The exemplary sting shaft consists of three coaxial shafts— only the outermost shaft is shown. The innermost shaft drives the crown gears that rotate the parts approximately around their longitudinal axes. A second coaxial shaft (not shown) is attached to one rake arm 180A, allowing that rake arm to be rotated around the axis of the sting shaft. The outermost coaxial shaft (shown) is attached to the other rake arm 180B, allowing that rake arm to be rotated around the axis of the sting shaft. Each shaft is driven by independent motors (not shown), allowing for independent rotation of parts around their approximate longitudinal axis and rotation of the rake arms around the sting shaft axis. This arrangement optimizes manipulation of parts to produce uniform coatings.

Figure 3A:
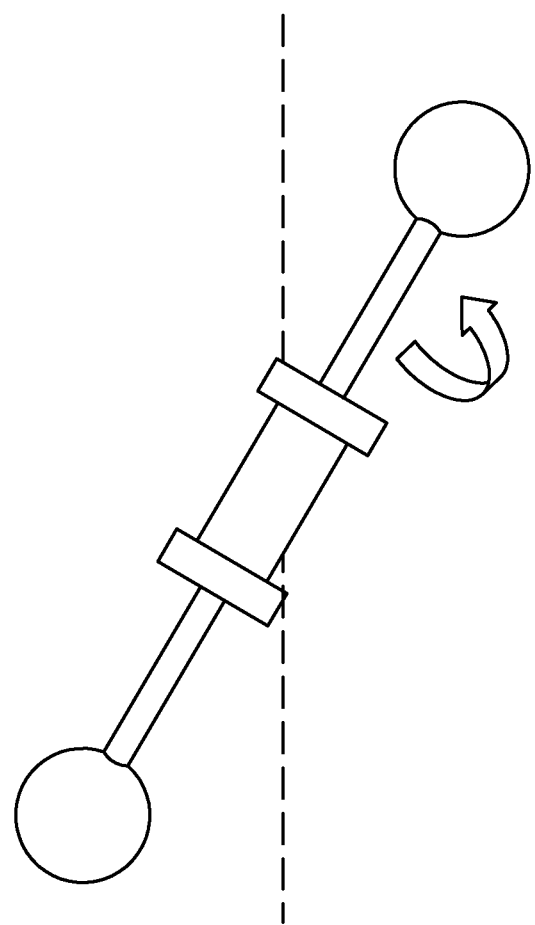
FIGS. 3A and 3B are schematic end views showing an alternate rake arm tilting configuration typically used with continuously rotating vanes to ensure uniform coating thickness and microstructure on both the airfoil and both platforms.
Figure 3B:
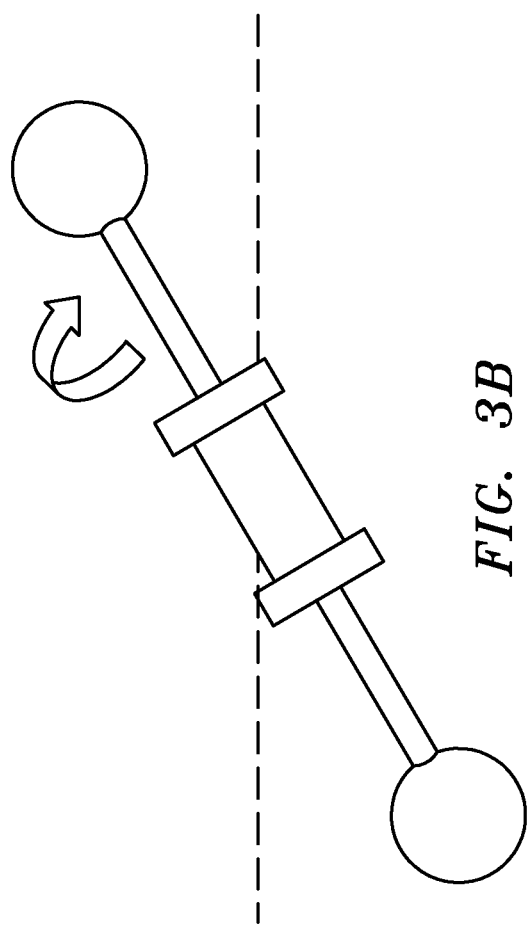

FIGS. 2A and 2B show schematic examples of rake arm manipulation as parts are coated. As drawn, rake arms alternately rotate to an exemplary 30 degrees above and below the horizontal. Parts are continuously or variably rotated as the rakes are tilted. Rotation may also be periodically stopped (e.g., for brief dwell intervals to achieve desired deposition distribution). This ensures uniform coating thickness and microstructure on both airfoil and platform surfaces. An alternate configuration for rake arm manipulation is shown in FIGS. 3A and 3B. One rake arm is rotated up while the other is rotated down. This configuration is typically used to coat vanes, to ensure uniform coating thickness and microstructure on both airfoil and platform surfaces.

FIG. 1, further shows a pumping system 50 coupled to the chamber. The exemplary pumping system comprises one or more pumps 52 (e.g., a frequency controlled variable pumping speed mechanical pump set). A diffusion pump (not shown-hidden under the isolation valve 54) pumps the chamber down to a high vacuum and can be kept open for conventional EB-PVD. The diffusion pump, however, is valved off for low vacuum EB-PVD so that the mechanical pumpset then does the pumping. The pumps are coupled to the chamber via an exemplary valve system including a proximal high vacuum valve 54 and a mechanical pumpset isolation valve 56 between the plenum and pump 52. The FIG. 1 pumps 52 are off the shelf items, but the optimum combination and sizing of blowers and backing mechanical pumps, with pumping speeds controlled by variable frequency motors, may be tailored for any particular application with the optimum sizing and combination of pumps in the pumpset based on specified flow rates and pressures to be used in operation.

A process gas supply system 60 comprises sources of one or more gases. An exemplary system 60 includes a supply 62A of oxygen (e.g., a tank or group thereof) and a supply 62B of argon (e.g., a tank or group thereof). There may be multiple ways of delivering gases from the sources to the chamber either separately or together. The exemplary system 60 has both sources feeding a common supply trunk 66 (with flows controlled by individual valves 64A and 64B). The exemplary trunk branches into separate branches 68 and 74 respectively delivering high mass flow rates and low mass flow rates. The branches 68 and 70 extend to the chamber and each includes an associated flow controller 72 and 74 and valves (unnumbered) on either side of each flow controller. The process gas supply system is discussed in more detail below.

There are gate valves 162, 166 shown in FIG. 1 on either side of the coating chamber. These valves isolate the coating chamber from preheat chambers 160, 164 on either side of the coater—partially drawn in FIG. 1. These preheat chambers contain heating elements surrounded by heat shields (neither shown), which heat the parts to temperatures of 1800° F. to 2000° F. (982° C. to 1093° C.), more particularly, 1800° F. to 1900° F. (1038° C. to 1093° C.), prior to coating. Mechanical and diffusion pumping systems (neither drawn in FIG. 1) are also plumbed to the preheat chambers. A partial second set of parts on rake arms is partially shown in the operative preheat position on the right side of FIG. 1. To maximize throughput, preheat and coating operations are synchronized to ensure that once parts are coated and retracted from one side of the coater, another set of parts is brought in to be coated on the other side of the coater.

Figures 1, 4:
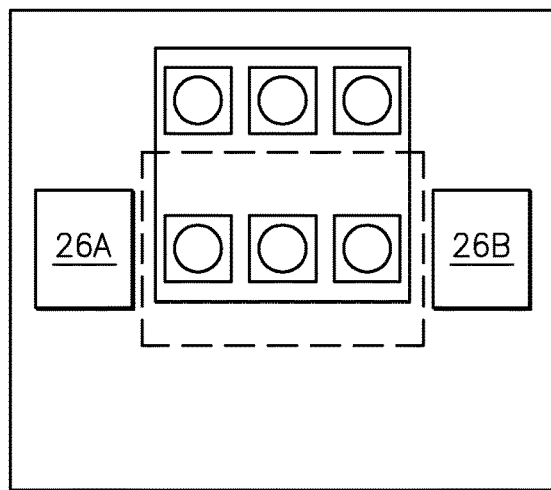
Figures 2, 4:
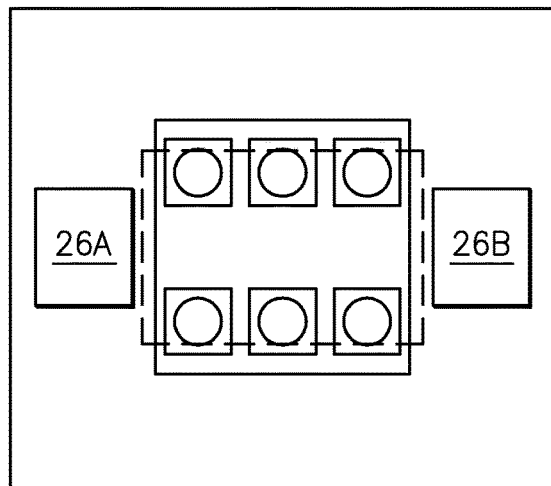
Figures 3, 4:
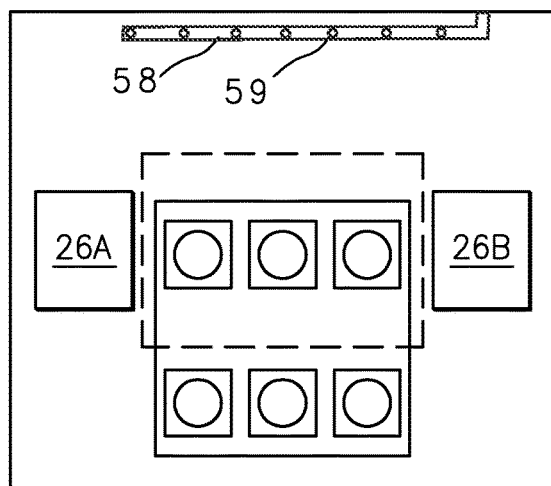

FIGS. 4-1 and 4-3 show a sequence of shifts of the assembly 40 between the initial position wherein the first set of crucibles are in the operative position (FIG. 4-1) through a third condition wherein the second set of crucibles is in the operative position (FIG. 4-3). In the intermediate condition of FIG. 4-2, an empty area between the ingot sets is in the operative position. However, the spacing between ingot sets is such that, at this condition, all the crucibles are within the field of view of at least one of the EB guns so that the gun may immediately jump from heating crucibles of the first set to heating crucibles of the second set without having to wait. During transition, the controller may be configured to expand the raster pattern of the guns to heat the second set of ingots while continuing to melt the first set of ingots that are initially in the operative position until a specific point in time where the raster patterns change to the other set.

Figure 5:
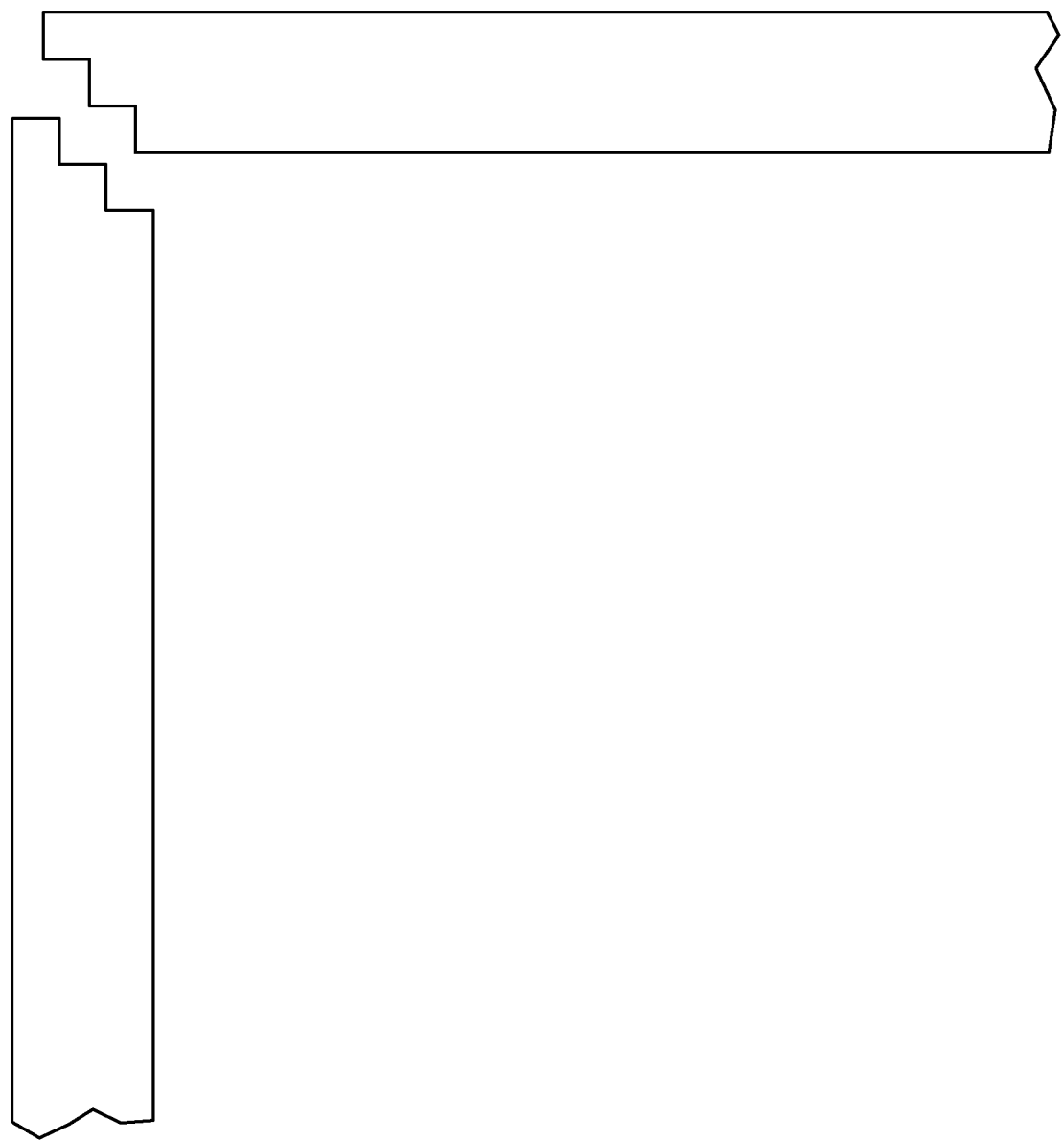
FIG. 5 is a schematic diagram of an exemplary stepped flange design used for welded and vacuum-sealed flanges for containment of high energy x-rays produced by interaction of high energy electrons with material in the coating chamber.

The vacuum chamber may be of existing configuration or modified (e.g., for improved robustness). With the EB guns operating at approximately twice typical voltages used in EB-PVD coaters, the chamber may be made more robust to handle the higher intensity/higher energy x-rays associated with the higher voltage. This may include providing thicker walls and adding stepped flanges to ensure x-ray containment. An exemplary stepped flange design is shown schematically exploded in FIG. 5.

Each exemplary power supply is capable of high voltage operation. However, they may be configured for a diverse range which may allow switching between a low vacuum and high voltage operating mode and a high vacuum and low voltage operating mode. Exemplary low vacuum modes in the vacuum level range 0.05 to 0.225 Torr (6.6 to 30 Pa), would require accelerating voltages above 30 kV and as high as 80 kV, or approximately twice state of the art accelerating voltage. Accelerating voltages ranging from 20 to 40 kV are used for prior art conventional EB-PVD (e.g., $1 \times 10^{-4}$ to 0.015 Torr (0.013 to 2.0 Pa) vacuum levels).

Figure 6:
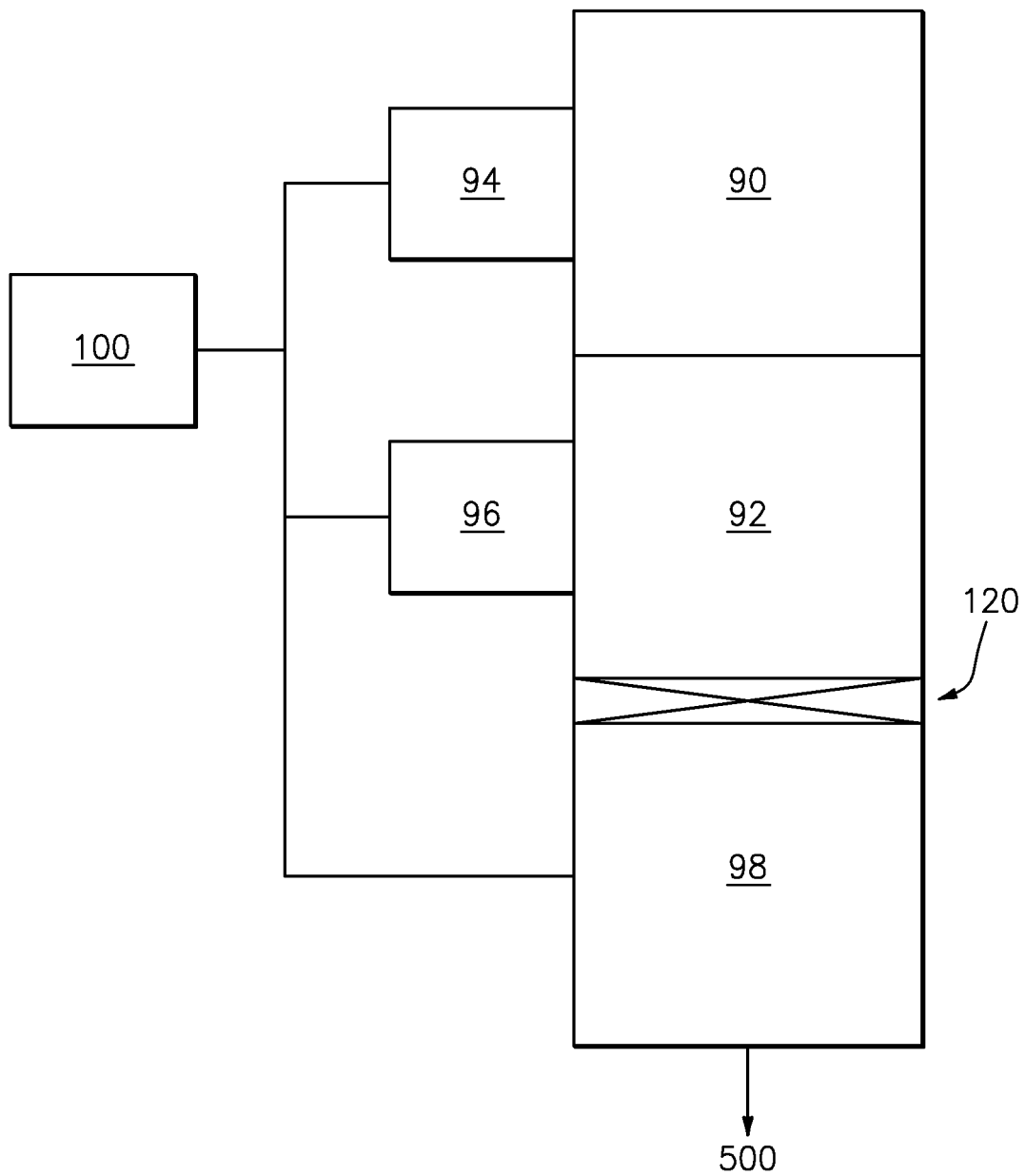
FIG. 6 is a schematic view of an electron beam gun of the system of FIG. 1.

FIG. 6 shows the EB guns as three-stage electron beam guns capable of operation at low vacuum. Each gun includes two stages 90, 92 pumped by turbomolecular pumps 94, 96 coupled to a remote mechanical pumpset at 100. The first stage 90 is formed by a cathode chamber. The second stage 92 is formed by an intermediate chamber. The third stage 98 is formed by a roughing chamber. The exemplary roughing chamber is separated from the intermediate chamber by an isolation valve 120. The exemplary roughing chamber is also coupled to the remote mechanical pumpset at 100. The exemplary electron beam 500 exits the roughing chamber. Within and at the top of the roughing chamber is a magnetic deflection coil that is driven by the control system to raster the electron beam over a pattern controlled by an external beam control system that is not shown. High frequency operation of the raster pattern is necessary to ensure uniform melting of the ingots in the crucible, especially when raster patterns are used to melt more than one ingot at a time.

The exemplary electron beam guns are capable of operation when coating chamber vacuum levels are as low (high numerically) as 0.225 Torr (30 Pa). Precise magnetic optics and feedback circuitry and logic (not shown) produce very tightly focused electron beams with small beam diameters, well centered in the gun's beam column. This enables minimization of the orifice diameters for the beam column, thus reducing the flux of gas and vapor from the coating chamber into the electron beam gun, for a given chamber pressure. High vacuum inside the gun is required, since gun components operate at high temperatures, and would rapidly oxidize at lower vacuum levels.

High accelerating voltage is required to accelerate electrons sufficiently for them to reach the melt pool without being scattered by background gases. The exemplary guns also use much higher frequency rastering than is used in current state of the art coaters. This facilitates evaporating two ingots with one gun (either when a given gun is used to heat both one of the peripheral ingots in the set and the center ingot or when the gun is used to switch between ingots of the two sets during the transition (e.g., to provide a graded composition transitioning between the two materials)).

Hardware components (e.g., the cathode plug and the anode ring assembly (not shown)) in the electron beam gun (not shown) may be changeable from a first set for low vacuum/high voltage operation to a second set for high vacuum/low voltage operation. The isolation valve 120 facilitates replacing of either of these. For example, the cathode plug assembly may also need to be replaced when the filament fails.

Figure 7:
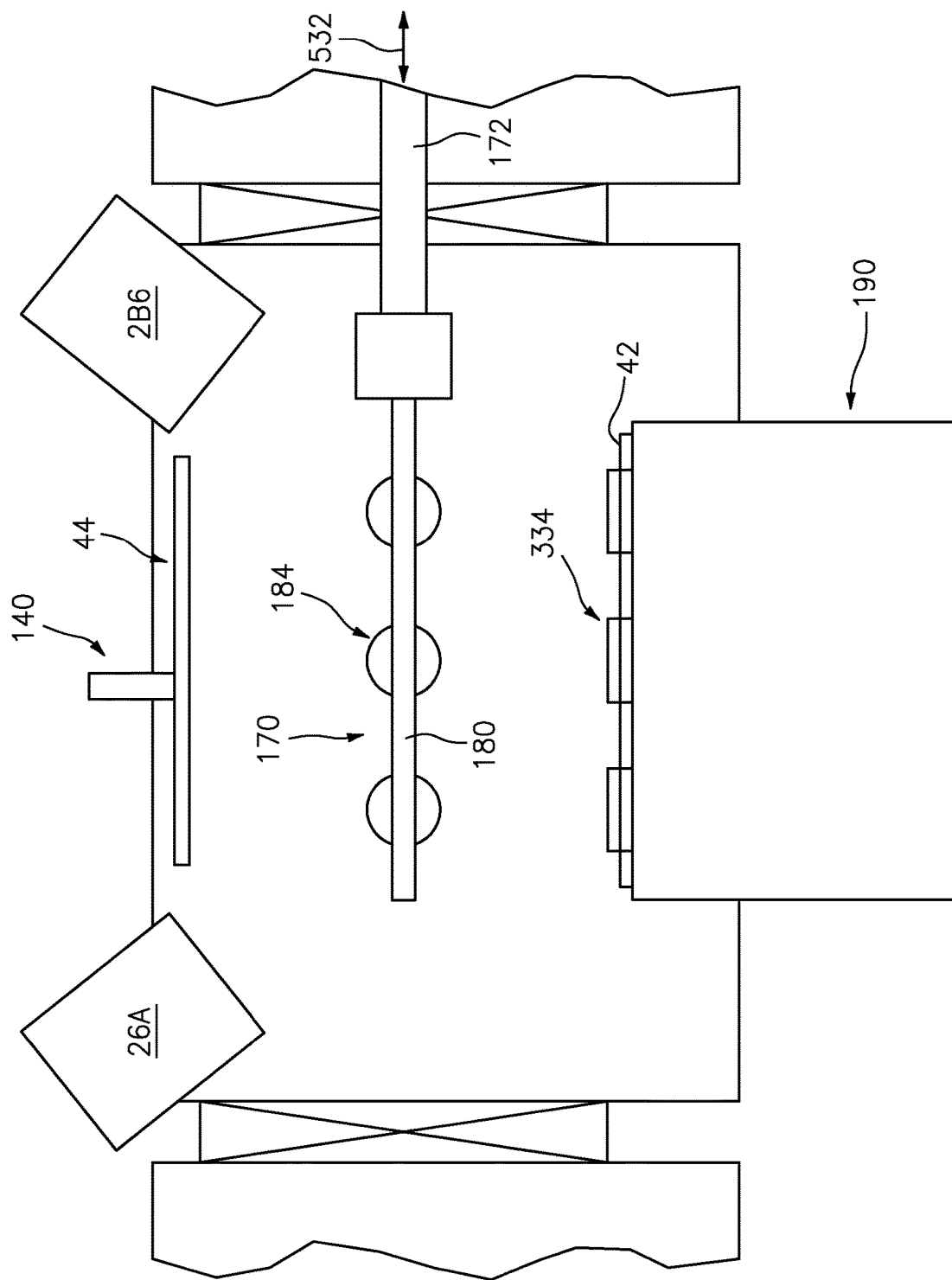
FIG. 7 is a side schematic view of the apparatus.

FIG. 7 shows the thermal hood 44 attached to an actuator 140 (e.g., a pneumatic cylinder) that enables it to be raised and lowered. The thermal hood serves to radiate heat back to the parts being coated. Adjusting the height of the thermal hood adjusts the temperature of the parts while they are coated. Part temperature during coating is a key factor for coating quality. An exemplary hood is flat or approximately semi-cylindrical and formed of a metal that may be water-cooled. FIG. 7 further shows the optional gravel tray 42. The exemplary gravel tray is a water-cooled metal tray that is filled with zirconia gravel. The electron beam raster pattern is adjusted to heat the gravel without melting it to provide radiative heat to the parts to maintain optimum part temperature during coating. A high raster frequency increases capability to fine-tune temperature control.

Each exemplary crucible is a water cooled copper crucible into which ceramic ingots are fed at a constant rate using a pusher rod. The electron beam melts the ingots, producing a melt pool that is contained by the crucible.

Previously noted, FIG. 1 schematically shows the tops of the ingots (or melt pool when in operation) consisting of a ceramic composition. Only one row of two or three ingots is evaporated at a time. This enables multilayer ceramic TBC coatings. To transition from one layer to another, the entire ingot assembly (all six crucibles and the feeders) is moved to position the other row of crucibles at the centerline of the coater. During the movement of the ingots, the electron beam raster patterns are programmed to move at the same rate, maintaining evaporation during this transition. When the midpoint between the rows of crucibles is situated at the chamber centerline, the electron beam raster patterns may be programmed to jump over to the other set of ingots, to start to deposit the $2^{nd}$ layer of ceramic coating, which consists of a different chemistry. Alternatively, the electron beam raster pattern may be programmed to start to heat the second set of ingots for a brief interval (e.g., three seconds to 100 seconds) before jumping over to the second set of ingots and operating at sufficient power/temperature to deposit from the second set. The exemplary first layer consists of 6-8 wt % $Y_2O_3$, 92-94% $ZrO_2$. The exemplary second layer consists of 53-65 wt % $Gd_2O_3$, 35 to 47 wt % $ZrO_2$. In other embodiments, even more layers can be created, by transitioning the ingots back and forth any number of times, or by adding additional rows of ingots.

The FIG. 1 pumps 52 are off the shelf items, but the optimum combination and sizing of blowers and backing screw pumps, with pumping speeds controlled by variable frequency motors, may be tailored for any particular application with the optimum sizing and combination of pumps in the pumpset based on specified flow rates and pressures to be used in operation.

FIG. 7 further shows the preheat chamber 160 to one side of the main chamber 22 separated by a gate valve 162. Along the opposite side, FIG. 7 shows a second preheat chamber 164 separated from the chamber 22 by a gate valve 166. The coating chamber is fed by two preheat chambers (one on each side) such that as one set of part is heated, another set is getting coated—the intent is to start melting, then continuously coat parts for a campaign lasting several days, at which point the coater has to be cleaned and the guns rebuilt. FIG. 7 further shows the rake arm assembly having a sting shaft 172 coupled to an actuator (not shown) for bidirectional motion in a direction 532 parallel to a central axis 530 of the sting shaft. The sting shaft 172 extends through the preheat chamber and load chamber (not shown) and ends in the sting shaft chamber (not shown).

FIG. 7 is a side view showing one of the two rake arms 180 coupled to the shaft 172. At a plurality of locations spaced along the arm, the arm has individual stations for engaging individual parts to be coated. Exemplary stations 184 are a crown bearing assembly that engages a geared shaft (not shown) inside the rake arm to drive rotation of the part about an associated axis 550 of the station. Exemplary stations may include a fixture portion complementary to some location on the part for gripping the part. In operation, exemplary part rotation rates are 5-100 rpm, more particularly, 40-80 rpm for EB-PVD done at vacuum levels ranging from 0.05 Torr to 0.225 Torr (6.6 Pa to 30 Pa). Alternative lower ends to the pressure range are 3.0 Pa, 4.0 Pa and 5.0 Pa. Exemplary part rotation rates for prior art conventional EB-PVD (with vacuum levels ranging from 0.0001 to 0.015 Torr (0.013 to 2.0 Pa)) range from 5 to 30 rpm.

FIG. 7 also schematically shows ingot feeder and crucible assembly 190. The ingot loaders and crucibles and gravel tray are vertically movable bidirectionally in a direction 560 by means of a vertical actuator (not shown). The entire crucible and feeder assembly is vertically adjusted (at the same time) to adjust standoff distance. The exemplary actuator and system and entirely within the vacuum chamber although shown protruding below for ease of reference. Such a configuration maintains vacuum during operation (i.e., avoids leaks) but requires a full breaking of the vacuum to adjust position. The actuator may be automatic (e.g., hydraulic pneumatic or motor operated) or may be manual (e.g., a manual jack). The vertical adjustment allows control over standoff distances between the melt pool surface and the parts. The standoff distance may be characterized as the distance between the sting shaft centerline and the plane of the meltpool surfaces or the rims of crucibles which may be just slightly higher. An exemplary range of standoff distance includes a range of between 8 and 25 inches (20 and 64 cm). This may be slightly higher than baseline distances of which an example is an 8-16 inches (20-41 cm) adjustment range. Thus, the exemplary system offers an adjustment to at least extend standoff distance to 23 inches (58 cm), more particularly, 24 inches (61 cm) or at least 25 inches (64 cm) and more particularly with a range of at least 15-25 inches (38-64 cm) for the low vacuum operation or 8-25 inches (20-64 cm) to contemplate two modes of operation as discussed above.

Figure 8:
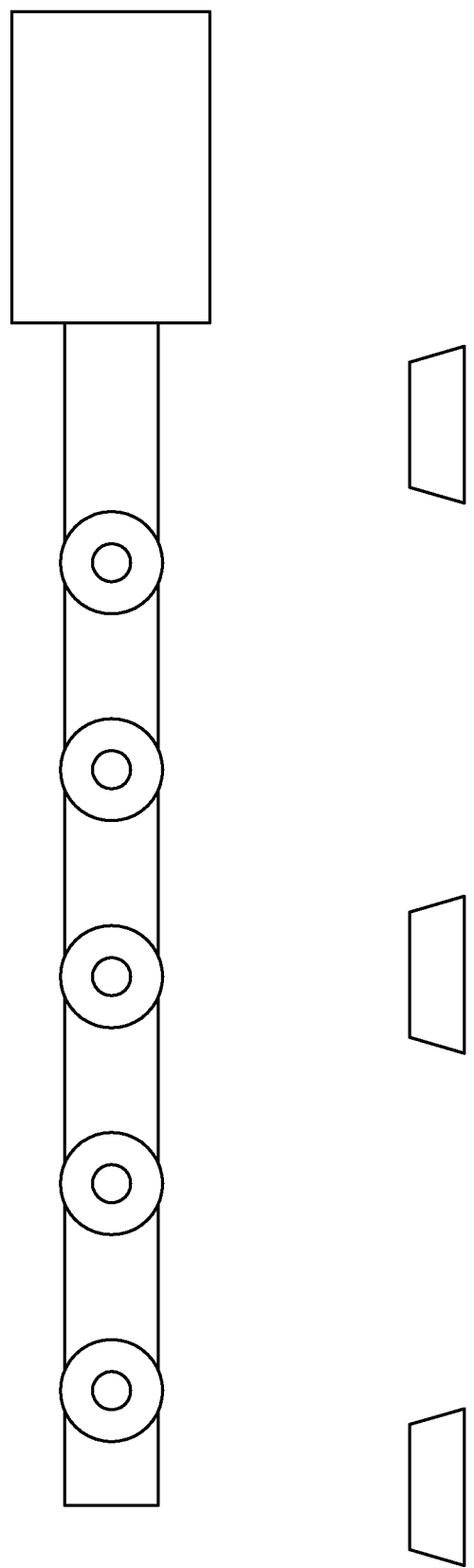
FIG. 8 is a side dimensional view of the positions of coating stations on a rake relative to deposition sources.
Figure 9:
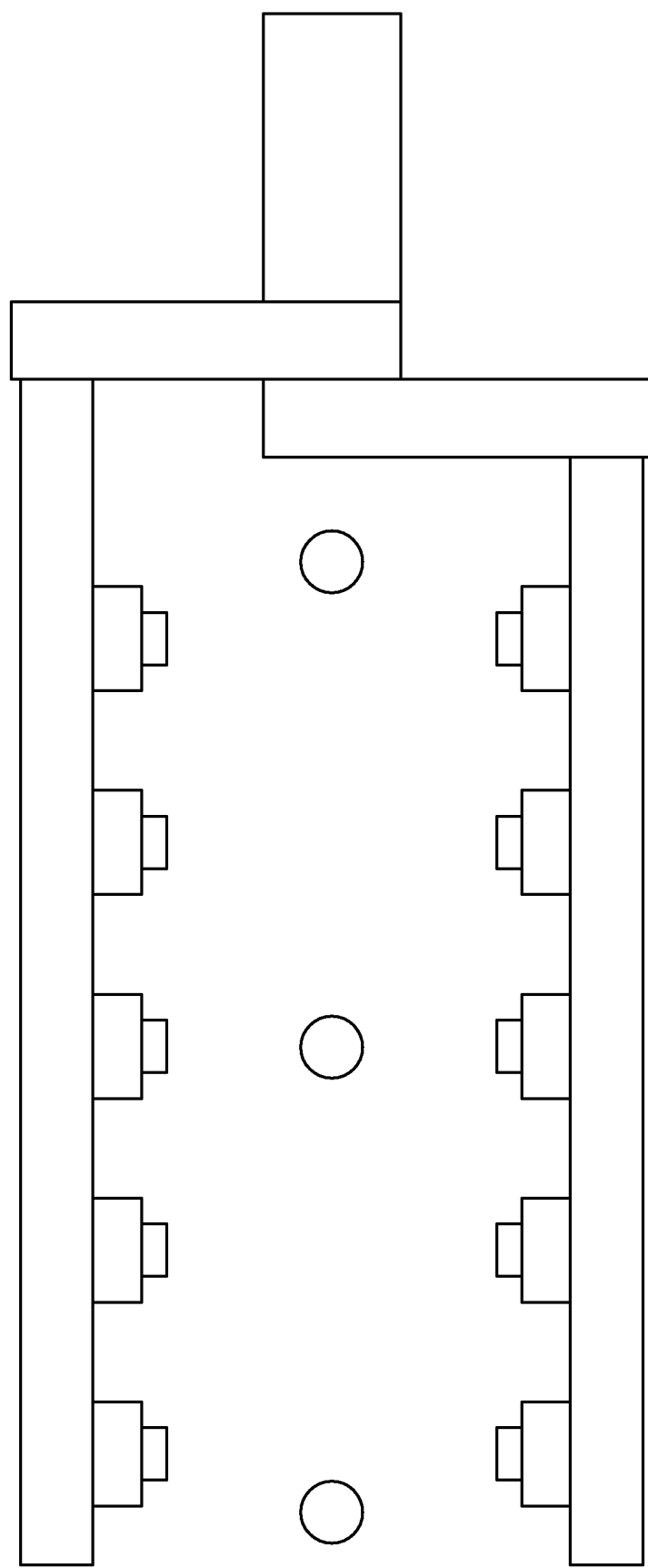
FIG. 9 is a plan view of the rake and sources of FIG. 5.

FIGS. 8 and 9 show two views of a two armed rake assembly wherein each arm has five stations. The rake arm is shown in the operative position, over an exemplary three crucible set. The exemplary stations are formed in opposed pairs that equal longitudinal position. Each of these five exemplary pairs is evenly spaced from the adjacent pair(s). The location of the extreme pairs of part stations are shown between the center and extreme ingot pairs—not outside of them, because the most uniform deposition zone occurs over that area, especially for low vacuum deposition up to 0.225 Torr (30 Pa).

Blades are typically held by the blade root—one blade per part station. The midspan of the airfoil may then be located above the centerline of the sting shaft. Then the rake arm is rotated such that the part tilts +/−30 degrees (more broadly, +/−10° to 45°) around an axis roughly through the midspan of the blade airfoil. Dwells at the extremes or horizontal position of the tilting range may be used for tens of seconds.

Vanes may be manipulated the same way as blades.

Alternatively, vanes may be attached to part stations on both rakes (at the same time), such that again the tilt axis is through the midspan of the vane airfoil. In this arrangement, the vanes may be tilted similarly to the blades. In this case, the rake arm motion is different than when the part is attached to only one rake. During tilting of parts attached to only one rake, the rake arm motion is analogous to flapping wings. When parts are attached to two rake arms, the tilt motion of the rake arms is similar to a seesaw motion.

One may also run vanes such that two vanes in a row are fixture such that the fixture is attached to both rakes. In this case, the tilt axis will run at the midpoint between the vanes, and the seesaw motion may be used.

One or more of several factors (e.g., modifications to baseline process and apparatus) may be utilized to improve NLOS deposition of TBCs.

TBC deposition at lower vacuum levels (e.g., up to 0.225 Torr (30 Pa), more particularly exemplary ranges of 0.05 to 0.225 Torr (6.6 to 30 Pa) or 0.1 to 0.225 Torr (13.3 to 30 Pa)) increase vapor molecule collisions in transit from the evaporation source to the part. This means that the vapor cloud produced will enable a higher degree of NLOS deposition than current state of the art EB-PVD processing.

Low vacuum EB-PVD may require modification to the coating equipment to enable deposition at 0.225 Torr (30 Pa). This includes a gun system capable of evaporating ceramic at these low vacuum levels. The electron beam guns in the exemplary embodiment will be set to a constant accelerating voltage. To increase power delivered to the ingot and melt pool, the beam current will be increased. As chamber pressure increases (and vacuum level decreases) the number of molecules per unit volume increases, by definition. Thus, for a given gun accelerating voltage and beam current, increasing the chamber pressure (and lowering the vacuum level) increases the probability for interaction between the electrons and the background gas molecules. The majority of gas-electron interactions are near elastic, meaning that very little energy transfer occurs during the interaction. However, the trajectory of the electrons (and the molecules, but to a much lesser extent) is altered. Summing this effect over the whole electron beam, the net effect of the elastic interactions is beam broadening. This is problematic, since it limits the precision of control of heating and melting.

In addition, some inelastic interactions occur. In this case, much more energy transfer occurs during the interaction between the electron and the molecule. These interactions typically scatter the electrons out of the beam, reducing the energy density in the beam, thus the evaporation rate and the deposition rate. As the pressure continues to increase (and vacuum level decreases), one eventually gets to the point where all of the electrons are inelastically scattered out of the beam—the beam is eliminated.

Higher accelerating voltage reduces the probability of interactions occurring between electrons and molecules.

For prior art EB-PVD, operating in the 0.0001 to 0.0015 Torr (0.013 to 2.0 Pa) pressure range, accelerating voltages in the range of 20 to 40 kV are used. For low vacuum EB-PVD, with pressure ranging from 0.05 to 0.225 Torr (6.6 to 30 Pa), the exemplary gun can be switched between operating ranges of 30-45 kV, preferably 40 kV and operating ranges of 60 to 90 kV, preferably 80 kV. In both modes, the maximum power delivered will be the same. That maximum power will be in the range 120 kW to 300 kW per gun.

Figure 10:
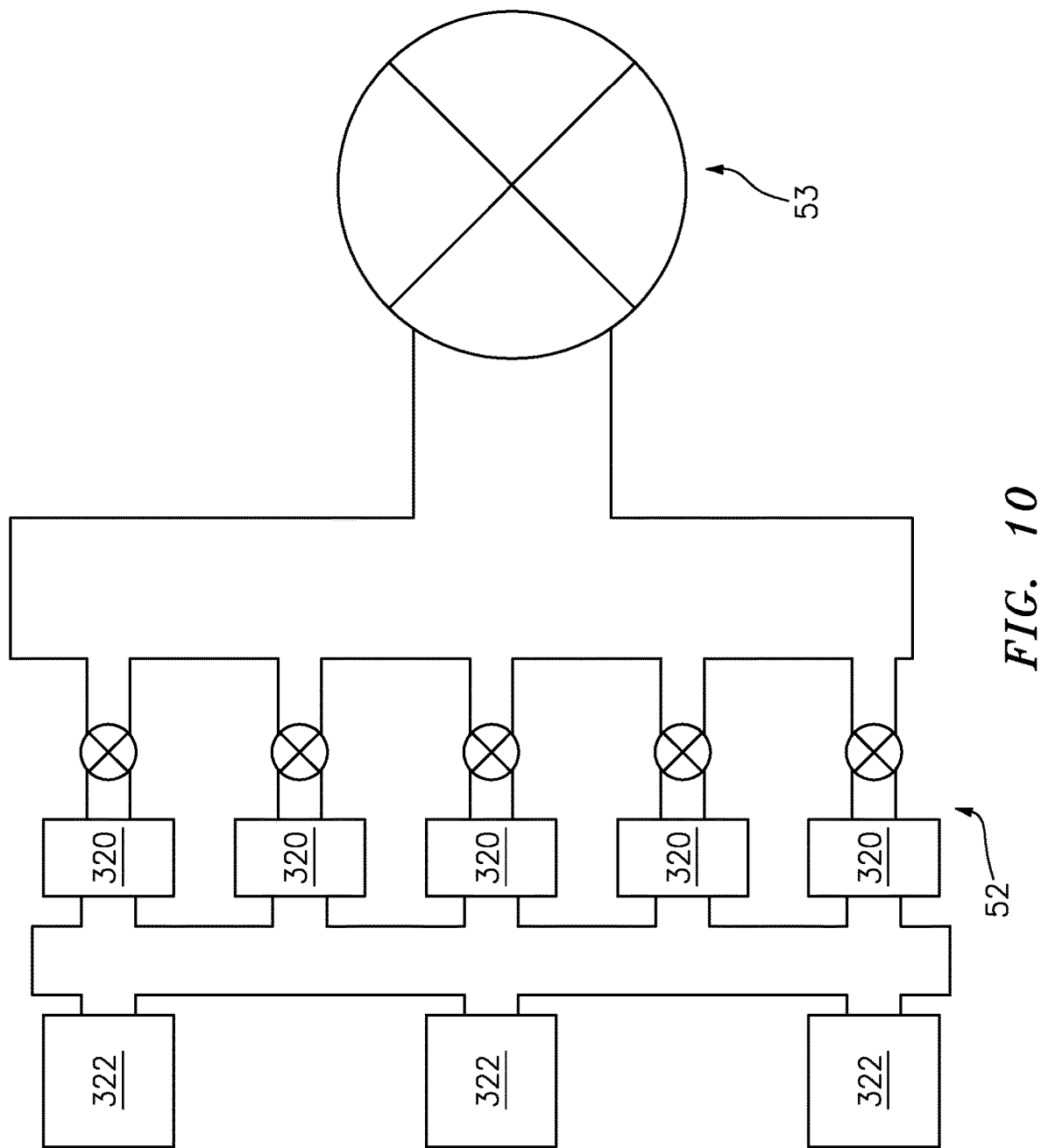
FIG. 10 is a plan view of an exemplary mechanical pumpset, pumping manifold, and chamber valve.

A vacuum system is used for control of vacuum level. The exemplary system is able to control vacuum level over a wide range (0.0001 to 0.225 Torr (0.013 to 30 Pa)), and will be able to handle a large range of process gas flowrates, maintaining control of vacuum level within +/−5%. The exemplary range of process gas flowrates is between 100 standard cubic centimeters per minute (sccm) and 100 standard liters per minute (slm). This vacuum level control capability is provided by an exemplary system that consists of one to five Roots blowers 320 (FIG. 10) that feed three mechanical pumps 322. Each of the blowers can be turned on or off, and the pumping speed for each blower that is on can be varied by varying the frequency of the AC power that is running it.

The crucible arrangement may be modified to provide a more a uniform vapor cloud for deposition thickness control.

A conventional process gas flow system is used for control of coat pressure and refinement of the vapor cloud.

In an exemplary high pressure EB-PVD mode, when the parts come in from the right preheat chamber, the left gun melts both the leftmost and center crucibles, while the right gun melts the right crucible. Vice-versa when the parts come in from the left preheat chamber. Melting may be done with a wide variety of raster patterns. Typically a round raster pattern may be used, with the amount of time the beam spends at the OD of the pattern is programmed to be more than at the center of the circle, to accommodate the heat loss into the water-cooled crucible.

The EB guns may operate at ~80 KV (e.g., 40-80 kV compared to prior art EB-PVD operation at ~20-40 kV) for better penetration of the higher pressure.

A high volume roughing pump system with high vacuum preheat system may be provided.

Shortening of the crucible to crucible distance may enable a more uniform distribution vapor cloud for coating multiple parts at a time.

An exemplary location for process gas inlet (outlet of the gas/inlet to the chamber interior) is at the bottom of the coating chamber, toward the center of the floor of the chamber, to maximize the distance between the process gas inlet and the electron beam guns. Alternative exemplary outlets of the gas system into the chamber interior are on a manifold low along one or more of the side walls. For example, the vacuum outlet from the chamber may be high along one wall (e.g., the rear) or along the top or the chamber near that wall while the gas outlets (inlets to the chamber interior) are low along the opposite wall (e.g., the front). The gas is thus introduced remote from the crucibles and oriented so as to merely pressurize and not serve as a motive flow propelling vapor toward the substrates as in DVD. FIG. 4-3 shows a manifold 58 with outlets 59 low along a front wall. Exemplary process gas flowrates at these inlets would be in the range of 3 to 100 slm, more particularly, 10 to 100 slm or 3 to 40 slm. Additionally, one or more process gas manifolds may be located near the crucibles or near the parts. Exemplary process gas flowrates through these manifolds may range from 100 to 1000 sccm.

This may be distinct from: a) a gas manifold surrounding the ingot assembly, with a valve allowing the gas manifold to be closed off (as used in DVD); and b) a gas manifold located just below the lowest position of the adjustable thermal hood with a valve allowing the gas manifold to be closed off. Gas flowrate in both manifolds are an exemplary between 20 and 1000 sccm. Oxygen or oxygen/argon mixes may be flowed in these manifolds.

Several design factors may be used to optimize coater design for coating thickness uniformity in the coating zone, optimal coating microstructure, and optimal deposition rate based on an empirical model described below.

Figure 11:
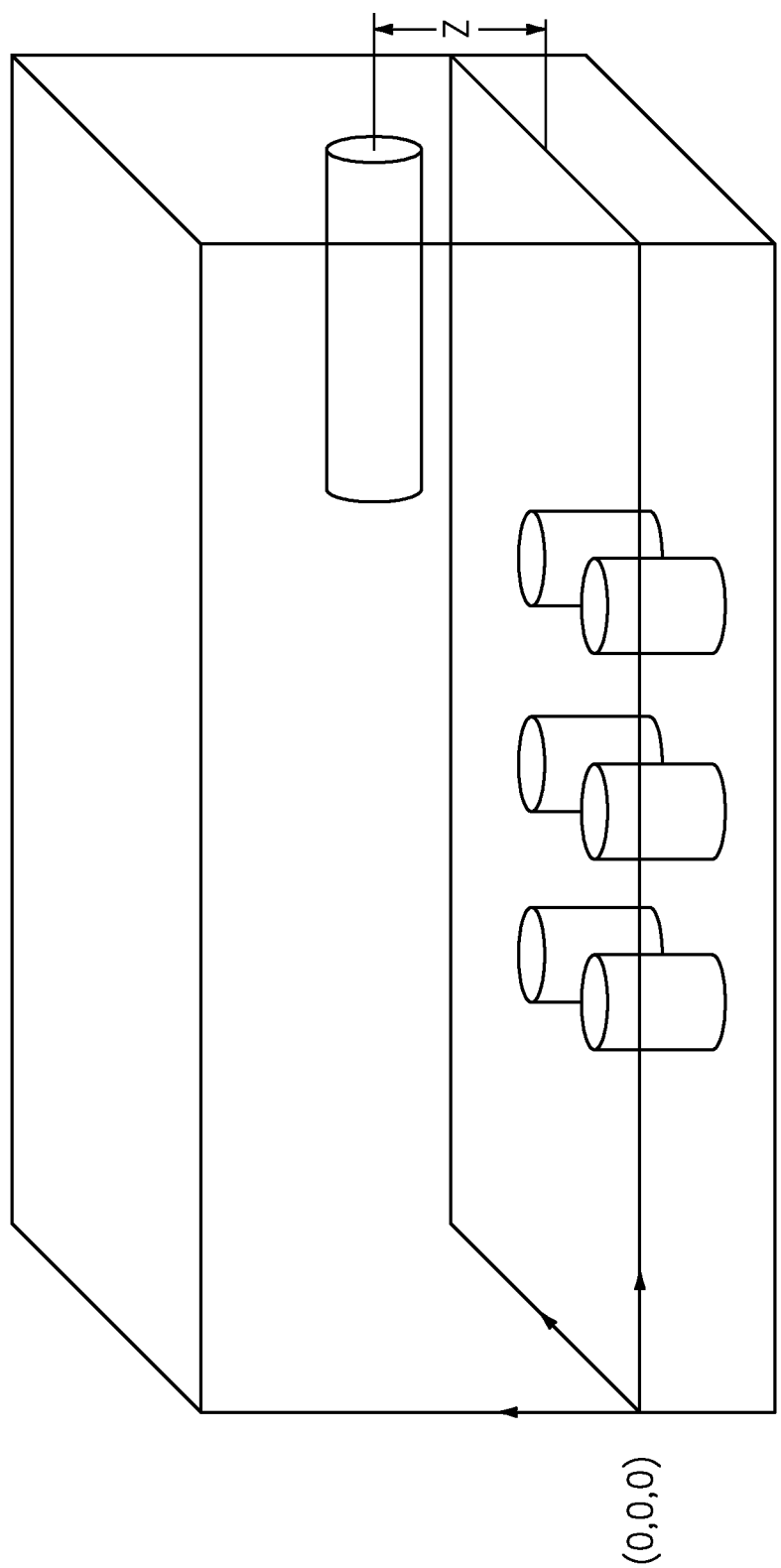
FIGS. 11 and 12 show a frame of reference.

The exemplary implementation of the model defines the z-coordinate of the plane defined by the melt pool surfaces as z=0, with positive z values being above the crucibles. The point of intersection of that plane with the front left corner of the coating chamber defines x=0 and y=0, as shown in FIG. 11. The standoff distance is then the distance between the plane at z=0 and the centerline of the sting shaft, as shown in FIG. 11.

Figure 12:
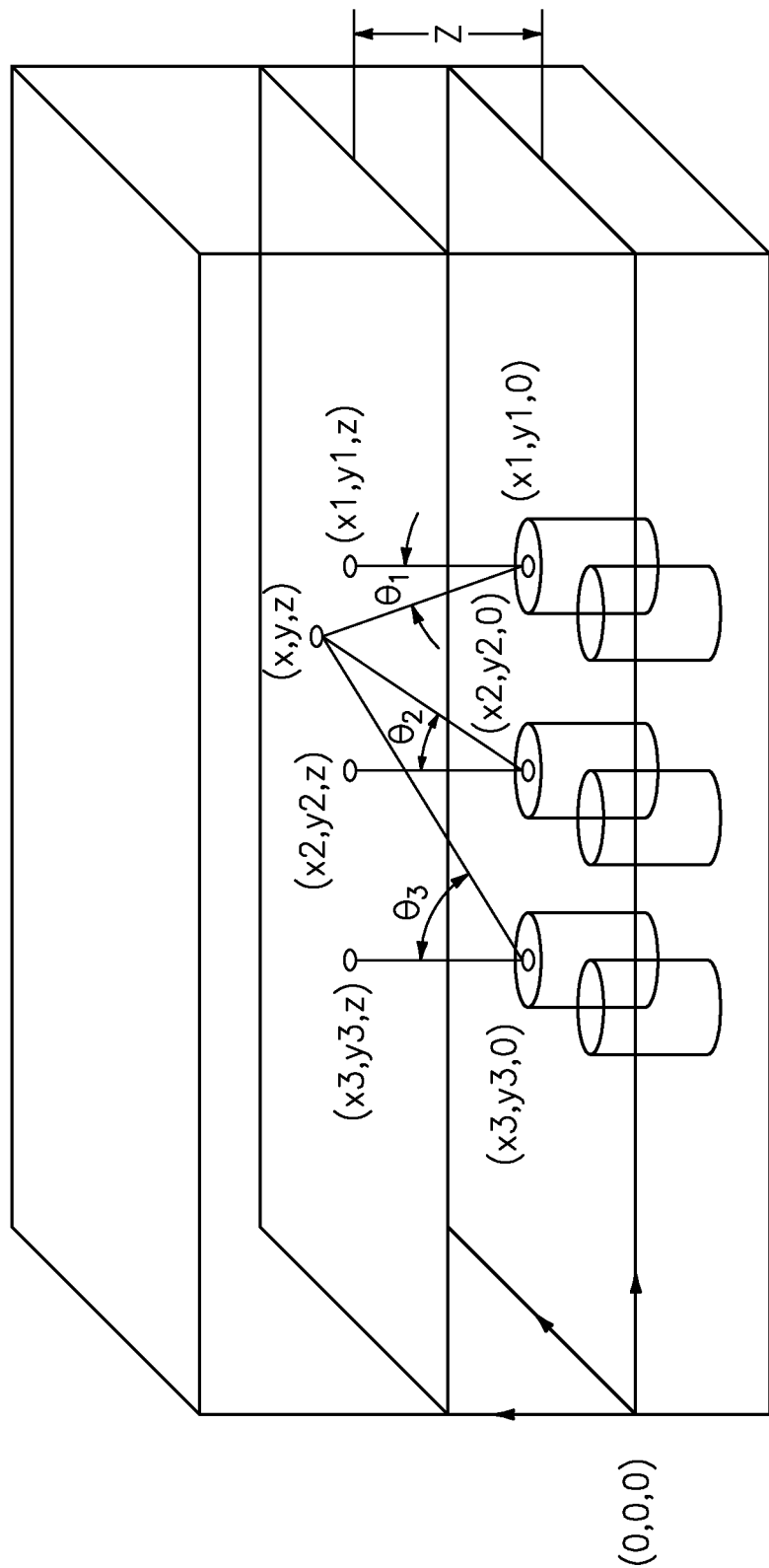

For EB-PVD coaters, and other vapor deposition coaters, the thickness of coating deposited at any given point (x,y,z) on a flat plate is known to follow the following functional form, assuming one vapor source (the melt pool in this case): Thickness/Max Thickness=$\cos^n(\theta)$ where $\theta$ refers to the angle subtended by the line from the center point of the circular ingot surface to the point in question and the line normal to the circular ingot surface at its center point, as shown in FIG. 12.

For multiple ingot sources, the distributions are superimposed to predict the thickness. For the example of the three ingot sources shown in FIGS. 11 and 12, the thickness ratio at any point, x, y, z is Thickness/Max Thickness=$\cos^n(\theta_1)+\cos^n(\theta_2)+\cos^n(\theta_3)$. The value of n may be determined empirically, by coating flat plates and fitting the data to the above equation.

This approach is well documented in the literature. For EB-PVD of thermal barrier coatings at conventional vacuum levels (0.0001 to 0.015 Torr (0.013 to 2.0 Pa)), exemplary values of n typically range from 2 to 5.

For low vacuum EB-PVD, the experiments described above were carried out and the data was fit to the above equation. It was surprisingly found that n varies in the range 20 to 25 when the vacuum level varies from 0.05 to 0.1 torr (6.7 to 13 Pa), respectively. This is a significantly steeper distribution than occurs in the known prior art.

Figure 13A:
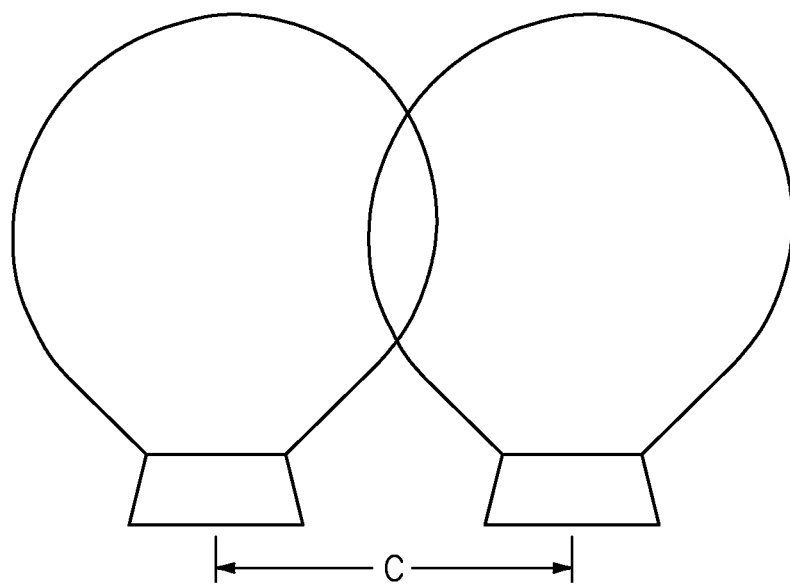
FIGS. 13A and 13B are schematic plots depicting the change in vapor plume dimensions between conventional EB-PVD and low vacuum EB-PVD.
Figure 13B:
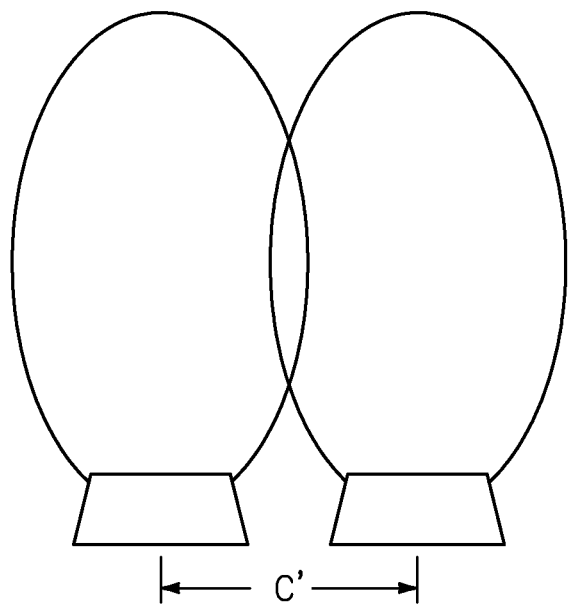

This discovery proved that coating under low vacuum conditions results in narrower vapor plumes, which requires closer spacing of the crucibles in the coating chamber. FIG. 13 shows a typical embodiment for prior art EB-PVD, showing relatively broad, overlapping vapor plumes produced over crucibles spaced with a spacing of C. FIG. 13 shows that the narrower vapor plumes produced in low vacuum EB-PVD require closer crucible spacing, C', to overlap the plumes, to produce uniform coating thickness on parts. Using the value of n determined in the experiment described above, the correct crucible spacing for low vacuum EB-PVD coating, C', can be determined, using the equation above.

As a consequence of the focusing of the vapor plumes that occurs in low vacuum EB-PVD, the coating deposition rate increases significantly. Deposition rates ranging from 0.0005 inch to 0.004 inch (0.013 mm to 0.10 mm), more narrowly, 0.0005 inch to 0.003 inch (0.013 mm to 0.076 mm) or, within that range 0.0005 inch to 0.001 inch (0.013 mm to 0.025 mm) or 0.0005 inch to 0.002 inch (0.013 mm to 0.05 mm) or or 0.0007 inch to 0.002 inch (0.018 mm to 0.05 mm) or 0.0008 inch to 0.002 inch (0.02 mm to 0.05 mm) of coating thickness increase per minute were observed repeatedly for low vacuum EB-PVD. Conventional prior art EB-PVD coating deposition rates are typically in the range of 0.0002 inch to 0.0004 inch (0.005 mm to 0.010 mm) per minute.

Similarly, there may be an optimal range of standoff distances over which the coating zone is uniform. As the standoff distance increases, uniformity increases. However, both the deposition rate per unit area on the part and the effectiveness of radiative heating of the parts by the melt pools and the gravel tray goes down as standoff distance increases. Using the above equation and empirical data has enabled a determination optimum standoff distance as a function of pressure: the range is from 15 to 22 inches (38 to 56 cm) for low vacuum EB-PVD coating.

Figure 14:
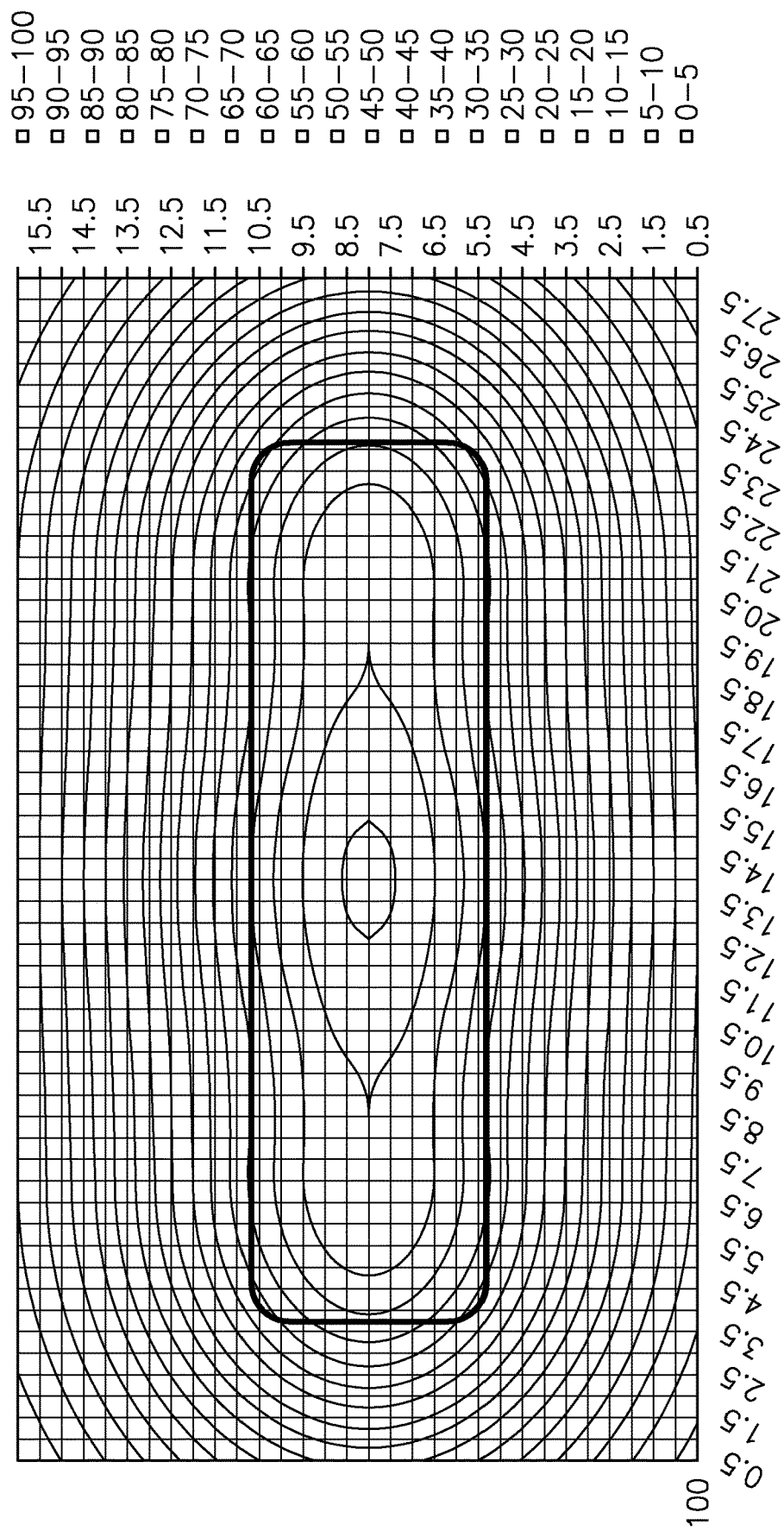
FIG. 14 is a plan plot of predicted coating thickness ratio on a plane in the coating chamber above the ingots and parallel to the ingot surfaces.

FIG. 14 is a plot of exemplary output from the empirical model described above for a vacuum level 0.1 Torr (13.3 Pa), three crucibles equidistantly spaced on a line with a spacing of 240 mm. The model shows the normalized thickness (Thickness/Max Thickness) as a function of position on the plane located at a standoff distance of 21 inches (53 cm). Each contour represents a range of 5%. The z-axis, coming out of the page in FIG. 14, represents the normalized thickness. The rounded rectangle drawn over the contour plot shows the approximate size and location of the coating zone—in which uniformity of the coating deposition is sufficient to ensure process capability.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing basic blade configuration, details of such configuration or its associated engine may influence details of particular implementations. Accordingly, other embodiments are within the scope of the following claims.

What is claimed is:

1. A method for operating a deposition apparatus (20), the deposition apparatus comprising:

a chamber (22);

a process gas source (62) coupled to the chamber;
a vacuum pump (52) coupled to the chamber;
at least two electron guns (26);
one or more power supplies (30) coupled to the electron guns;
a plurality of crucibles (32,33,34) positioned or positionable in an operative position within a field of view of at least one said electron gun and comprising a first set of crucibles and a second set of crucibles; and
a part holder (170) having at least one holder operative position for holding parts spaced above the crucibles,
the method comprising:
powering the electron guns to generate respective electron beams;
heating the first set of crucibles with the electron guns to vaporize material from the first set of crucibles;
shifting the first set out of the crucible operative position and the second set into the crucible operative position, wherein in an intermediate condition an area between the first and second sets is in the crucible operative position; and
heating the second set of crucibles with the electron guns to vaporize material from the second set of crucibles, wherein during a transition from heating crucibles of the first set to heating crucibles of the second set, beginning to heat the second set while continuing to heat the first set until a specific point in time.

2. The method of claim 1 wherein:
in the intermediate condition, the crucibles of the first set and the second set are within the field of view of at least one of the EB guns and the gun jumps from heating crucibles of the first set to heating crucibles of the second set without having to wait.

3. The method of claim 1 wherein:
the first and second sets respectively comprise a first row and a second row; and the shifting is of the first row and second row as an assembly.

4. The method of claim 1 wherein:
during the shifting, a raster pattern of the guns initially moves with the first set.

5. The method of claim 1 wherein:
during the shifting, a raster pattern of the guns initially moves with the first set and then expands to also heat the second set and then contracts to heat only the second set.

6. The method of claim 1 wherein:
the first set and the second set have ingots of different chemistries from each other.

7. The method of claim 1 wherein:
the parts are turbine engine blades or vanes.

8. The method of claim 1 wherein:
the materials of the first and second sets of crucibles are ceramics.

9. The method of claim 1 wherein:
the material of the first set of crucibles is a first ceramic; and
the material of the second set of crucibles is a second ceramic different from the first ceramic.

10. The method of claim 1 wherein in the operative position, the part holder holds parts spaced above the crucibles by a standoff height H, the method further comprising:
adjusting the standoff height H to a value in the range of 8 to 25 inches;
controlling the process gas source and the vacuum pump to maintain an atmosphere of 3.0-30 Pa absolute pressure;
and
controlling the electron guns and power supplies to 20 kV to 90 kV at 160-300 kW per gun.

11. The method of claim 10 wherein:
the absolute pressure is 6.6 Pa to 30 Pa.

12. The method of claim 10 wherein:
the adjusting the standoff height H is to a value in a range of 15 inches to 25 inches.

13. The method of claim 12 wherein the operating is operating in a first mode and further comprising operating in a second mode by:
adjusting the standoff height H to a value in a range of 8 to 18 inches;
controlling the process gas source and the vacuum pump to maintain an atmosphere of at most 2.0 Pa absolute pressure.

14. The method of claim 10 wherein:
the controlling of the process gas source results in flowrates 3 to 100 slm.

15. The method of claim 10 wherein:
the controlling of the process gas source results in flowrates 3 to 40 slm.

16. The method of claim 10 wherein:
the controlling the electron guns and power supplies is to a power of 120 kW to 300 kW per gun.

17. The method of claim 10 wherein the control is such that:
a thickness ratio deposited on a flat plate held stationary above the crucibles at any point, x, y, z can be approximated by the equation:

$$\text{Thickness/Max Thickness} = \cos^n(\theta_1) + \cos^n(\theta_2) + \cos^n(\theta_3),$$ where $n$ ranges from 5 to 25.

18. A deposition apparatus (20) comprising:
a chamber (22);
a process gas source (62) coupled to the chamber;
a vacuum pump (52) coupled to the chamber;
at least two electron guns (26);
one or more power supplies (30) coupled to the electron guns;
a plurality of crucibles (32,33,34) positioned or positionable in an operative position within a field of view of at least one said electron gun, the plurality of crucibles comprising a first set of crucibles and a second set of crucibles; and
an actuator coupled to the first and second sets of crucibles to shift the first and second sets into and out of the operative position.

19. The apparatus of claim 18 wherein:
each of the plurality of crucibles has an associated ingot loader;
the ingot loaders of the first set are different from the ingot loaders of the second set; and
the ingot loaders of the first set carry ingots of different composition than do the ingot loaders of the second set.

20. The apparatus of claim 18 wherein:
each set comprises a row of three crucibles;
in an intermediate condition an area between the first and second sets is in the operative position; and
in the intermediate condition, the crucibles of the first set and the second set are within the field of view of at least one of the EB guns.

* * * * *